US012563706B2

(12) United States Patent
Goyal et al.

(10) Patent No.: US 12,563,706 B2
(45) Date of Patent: Feb. 24, 2026

(54) SERVER SYSTEM LIQUID COOLING SYSTEM

(71) Applicant: Dell Products L.P., Round Rock, TX (US)

(72) Inventors: Nitin Goyal, Chandler, AZ (US); Owen O. Kidd, Cedar Park, TX (US); Daniel Alvarado, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 216 days.

(21) Appl. No.: 18/545,811

(22) Filed: Dec. 19, 2023

(65) Prior Publication Data

US 2025/0203822 A1 Jun. 19, 2025

(51) Int. Cl.
*H05K 7/20* (2006.01)
*H01L 23/473* (2006.01)

(52) U.S. Cl.
CPC ..... *H05K 7/20772* (2013.01); *H05K 7/20236* (2013.01); *H05K 7/20272* (2013.01); *H01L 23/4735* (2013.01)

(58) Field of Classification Search
CPC .......... H05K 7/20236; H05K 7/20772; H05K 7/20272; H01L 23/4735
See application file for complete search history.

(56) References Cited

U.S. PATENT DOCUMENTS 6,205,799 B1 * 3/2001 Patel ...................... F25B 39/04
236/46 F
7,916,483 B2 * 3/2011 Campbell .......... H05K 7/20772
165/80.4
8,944,151 B2 * 2/2015 Flotta ................ H05K 7/20772
165/80.4

FOREIGN PATENT DOCUMENTS

CN 105658037 A * 6/2016 ......... H05K 7/20927
CN 114916188 A * 8/2022 ......... H05K 7/20254

OTHER PUBLICATIONS

Rick Merritt, Cool It: Team Tackles the Thermal Challenge Data Centers Face, NVIDIA, May 25, 2023, https://blogs.nvidia.com/blog/liquid-cooling-doe-challenge/.
Motivair, Data Center & IT Cooling, ChilledDoor®, downloaded from the Internet Jan. 5, 2024 https://www.motivaircorp.com/products/chilleddoor/.

* cited by examiner

*Primary Examiner* — Zachary Pape
(74) *Attorney, Agent, or Firm* — Terrile, Cannatti & Chambers, LLP; Stephen A. Terrile

(57) ABSTRACT

A cooling liquid distribution system for an immersion cooled server type information handling system. The cooling liquid distribution system includes an information handling system chassis and a top panel portion, the top panel portion comprising a top panel top wall and a top panel bottom component, the top panel top wall being configured to be hermetically sealed to the information handling system chassis when the top panel portion is installed on the information handling system chassis, the top panel top wall and the top panel bottom component being hermetically sealed along edges of the top panel bottom component to provide a liquid distribution chamber, the top panel bottom component defining a plurality of cold liquid outlets, the plurality of cold liquid outlets being positioned to direct cooling liquid flow across a top of an interior of an information handling system chassis of the immersion cooled server type information handling system.

18 Claims, 10 Drawing Sheets

100

142

112

SERVER SYSTEM LIQUID COOLING SYSTEM

BACKGROUND OF THE INVENTION

Field of the Invention

The present invention relates to information handling systems. More specifically, embodiments of the invention relate to server type information handling systems within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method for providing a server type information handling system with internal immersion cooling which includes a liquid cooling liquid distribution system with integrated and ducted liquid pathways. In various embodiments, internal immersion cooling, an entire interior of a chassis of a server type information handling system is filled with liquid and sealed to prevent liquid escape with the exception of predefined ingress and egress points.

In one embodiment, the invention relates to a chassis liquid cooling liquid distribution component of an immersion cooled server type information handling system, comprising: a top panel portion, the top panel portion comprising a top panel top wall and a top panel bottom component, the top panel top wall and the top panel bottom component being hermetically sealed along edges of the top panel bottom component to provide a liquid distribution chamber, the top panel bottom component defining a plurality of cold liquid outlets, the plurality of cold liquid outlets being positioned to direct cooling liquid flow across a top of an interior of an information handling system chassis of the immersion cooled server type information handling system.

In another embodiment, the invention relates to a cooling liquid distribution system for an immersion cooled server type information handling system comprising: an information handling system chassis; and, a top panel portion, the top panel portion comprising a top panel portion, the top panel portion comprising a top panel top wall and a top panel bottom component, the top panel top wall and the top panel bottom component being hermetically sealed along edges of the top panel bottom component to provide a liquid distribution chamber, the top panel bottom component defining a plurality of cold liquid outlets, the plurality of cold liquid outlets being positioned to direct cooling liquid flow across a top of an interior of an information handling system chassis of the immersion cooled server type information handling system.

In another embodiment, the invention relates to a system comprising: an information handling system chassis; a processor contained within the information handling system chassis; a data bus coupled to the processor; and, a top panel portion, the top panel portion comprising a top panel portion, the top panel portion comprising a top panel top wall and a top panel bottom component, the top panel top wall and the top panel bottom component being hermetically sealed along edges of the top panel bottom component to provide a liquid distribution chamber, the top panel bottom component defining a plurality of cold liquid outlets, the plurality of cold liquid outlets being positioned to direct cooling liquid flow across a top of an interior of an information handling system chassis of the immersion cooled server type information handling system.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
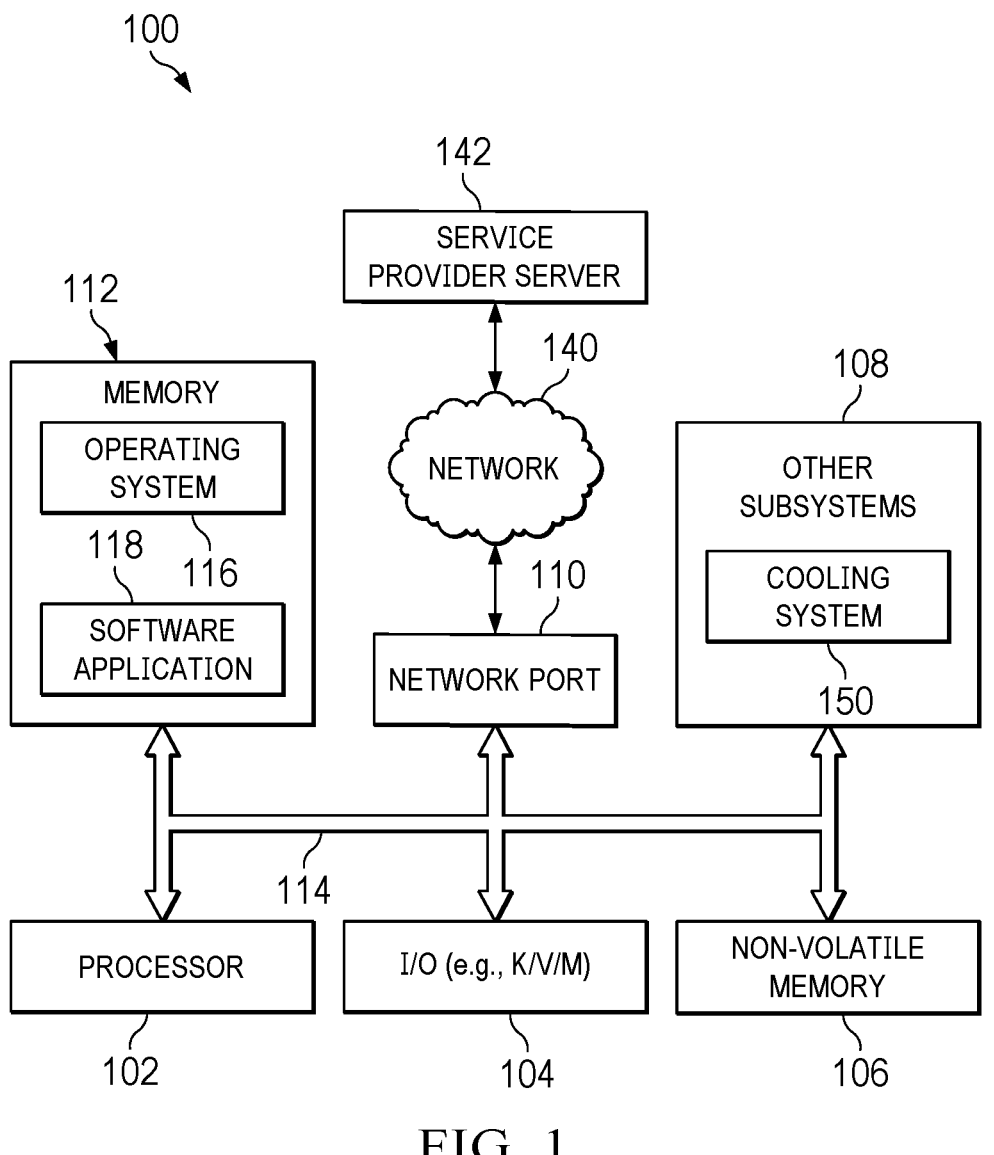
FIG. 1 shows a general illustration of components of an information handling system as implemented in the system and method of the present invention.

Various aspects of the disclosure include an appreciation that with server type information handling systems, high power components such as processors, graphics processing units, etc. can have very demanding cooling needs. Various aspects of the disclosure include an appreciation that with server type information handling systems having hermetically sealed immersion chassis, these high power components may not have the volume of thermally conductive liquid they need to dissipate their entire thermal design power (TDP) through thermal convection alone.

Various aspects of the present disclosure include an appreciation that certain known hermetically sealed immersion chassis use a hybrid solution which provides direct liquid cooling (DLC) for these high powered components while using the immersed chassis to deal with other, lower powered workloads. Various aspects of the present disclosure include an appreciation that such a hybrid DLC/immersion approach comes with added cost and complexity. Various aspects of the present disclosure include an appreciation that such a hybrid DLC/immersion approach often uses dedicated liquid piping to cool the high power components.

A system and method for providing server system with internal immersion cooling which includes a liquid cooling liquid distribution system with integrated and ducted liquid pathways. In certain embodiments, the system and method provide an information handling system with internal immersion cooling. In certain embodiments, the system and method provide a liquid cooling liquid distribution system. In certain embodiments, the liquid cooling liquid distribution system includes integrated and ducted liquid pathways. In certain embodiments, the liquid cooling liquid distribution system provides a focused flow of incoming cooling liquid to cool high power components of the information handling system in a hermetically sealed immersion chassis. In certain embodiments, the liquid cooling liquid distribution system provides simple ducting of the incoming liquid to focus the cooling liquid on the high power components inside the system. In various embodiments, the liquid cooling liquid distribution system includes a chassis liquid cooling liquid distribution component, one or more heat spreader components, or a combination thereof.

In certain embodiments, the chassis liquid cooling liquid distribution component is associated with a chassis top panel portion (i.e., a chassis lid portion). In certain embodiments, the chassis top panel portion is configured to hermetically seal the server chassis when installed, thereby maintain the coolant within the chassis, and to be removable to allow for service of internal server components. In certain embodiments, the chassis top panel portion includes and is integrated with a primary coolant inlet. In certain embodiments, the chassis top panel portion is configured with a liquid distribution chamber which functions as a cavity which distributes the coolant input. In certain embodiments, the chassis top panel portion is configured with a plurality of liquid exit apertures. In certain embodiments, the plurality of liquid exit apertures includes variously shaped exits or lengthened passageways which function as ducts to shape the cooling liquid flow. In certain embodiments, the plurality of liquid exit apertures shape the quantity and path of the cooling liquid flow towards higher powered components of the server type information handling system.

In various embodiments, the liquid cooling liquid distribution system associates respective heat spreader components with high powered components. In certain embodiments, the heat spreader components include low profile heat spreaders which maximize the surface area of a cooling surface when in contact with liquid. In certain embodiments, the low profile heat spreaders are similar to de-lidded water blocks. The coolant directed towards these low profile heat spreaders carry away heat from their associated high power components. The coolant is then extracted from the server type information handling system via a coolant outlet integrated with the hermetically sealed chassis of the server type information handling system.

Such a liquid cooling liquid distribution system advantageously provides enhanced cooling in chassis level immersion designs for devices having high thermal design power requirements which can present a need for more coolant flow than ambient convection could provide.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. In various embodiments, one or both the other subsystems 108 or the network port 110 include a cooling system 150. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack. In certain embodiments, the other subsystem 108 includes one or more power supplies for supplying power to the other components of the information handling system 100.

In certain embodiments, the information handling system 100 comprises a server type information handling system. In certain embodiments, the server type information handling system comprises a blade server type information handling system. As used herein, a blade server type information handling system broadly refers to an information handling system which is physically configured to be mounted within a server rack.

In certain embodiments, the cooling system 150 provides the information handling system 100 with internal immersion cooling. In certain embodiments, the cooling system 150 includes a liquid cooling liquid distribution system. In certain embodiments, the liquid cooling liquid distribution system includes integrated and ducted liquid pathways. In certain embodiments, the liquid cooling liquid distribution system provides a focused flow of incoming cooling liquid which cool high power components of the information handling system in a hermetically sealed immersion chassis. In certain embodiments, the liquid cooling liquid distribution system provides simple ducting of the incoming liquid to focus the cooling liquid on the high power components inside the system. In various embodiments, the liquid cooling liquid distribution system includes a liquid tight information handling system chassis (i.e., a chassis configured to enable liquid immersion cooling of components contained within the chassis), a chassis liquid cooling liquid distribution component, one or more heat spreader components, or a combination thereof.

In certain embodiments, the chassis liquid cooling liquid distribution component is associated with a chassis top panel portion (i.e., a chassis lid portion). In certain embodiments, the chassis top panel portion is configured to hermetically seal the server chassis when installed, thereby maintaining the coolant within the chassis, and to be removable to allow for service of internal server components. In certain embodiments, the chassis top panel portion includes and is integrated with a coolant inlet. In certain embodiments, the chassis top panel portion is configured with a liquid distribution chamber which functions as a cavity which distributes the coolant received via the coolant input. In certain embodiments, the chassis top panel portion is configured with a plurality of liquid exit apertures. In certain embodiments, the plurality of liquid exit apertures include variously shaped exits or lengthened passageways which function as ducts to shape the cooling liquid flow. In certain embodiments, the plurality of liquid exit apertures shape the quantity and path of the cooling liquid flow towards higher powered components of the server type information handling system.

In various embodiments, the liquid cooling liquid distribution system associates respective heat spreader components with high powered components. In certain embodiments, the heat spreader components include low profile heat spreaders which maximize the surface area of a cooling surface when in contact with liquid. In certain embodiments, the low profile heat spreaders are similar to de-lidded water blocks (e.g., the low profile heat spreaders correspond to a base portion of a water block). The coolant directed towards these low profile heat spreaders carry away heat from their associated high power components. The coolant is then extracted from the server type information handling system via a coolant outlet integrated with the hermetically sealed chassis of the server type information handling system.

Figure 2:
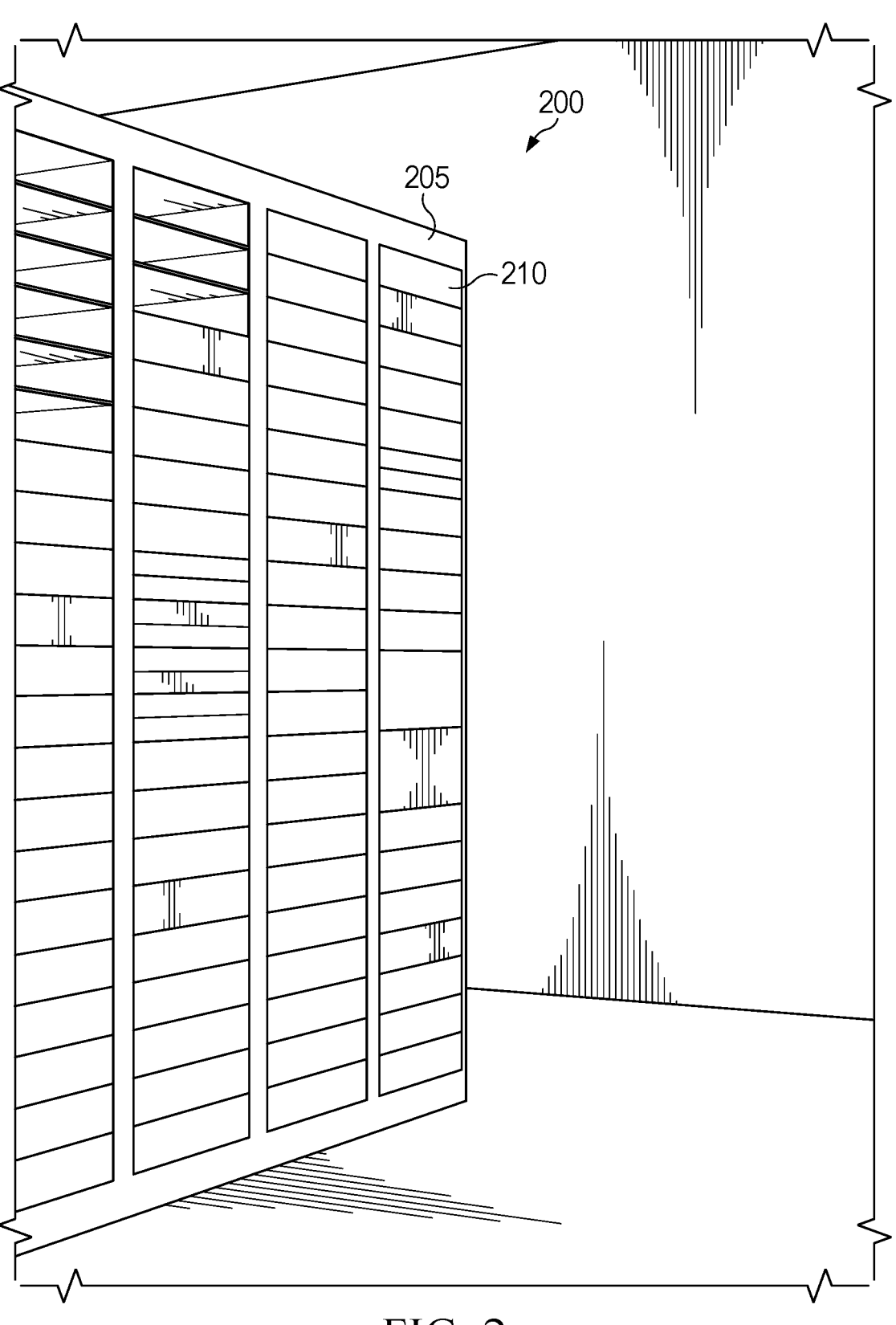
FIG. 2 shows a perspective view of a portion of a data center within an IT environment.

FIG. 2 shows a perspective view of a portion of an IT environment 200. The IT environment includes one or more racks 205 which include a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type information handling systems, server type information handling systems and application delivery controller type information handling systems. In certain environments, the information handling systems 100 are mounted within respective racks. As used herein, a rack refers to a physical structure that is designed to house the information handling systems 100 as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

In certain embodiments, a plurality of racks is arranged continuous with each other to provide a rack system. An IT environment can include a plurality of rack systems arranged in rows with aisles via which IT service personnel can access information handling systems mounted in the racks. In certain embodiments, the aisles can include front aisles via which the front of the information handling systems may be accessed and hot aisles via which the infrastructure (e.g., data and power cabling) of the IT environment can be accessed.

Each respective rack includes a plurality of vertically arranged information handling systems 210. In certain embodiments, the information handling systems may conform to one of a plurality of standard server sizes. In certain embodiments, the plurality of server sizes conforms to particular rack unit sizes (i.e., rack units). As used herein, a rack unit broadly refers to a standardized server system height. As is known in the art, a server system height often conforms to one of a 1 U rack unit, a 2 U rack unit and a 4 U rack unit. In general, a 1 U rack unit is substantially (i.e., +/−20%) 1.75" high, a 2 U rack unit is substantially (i.e., +/−20%) 3.5" high and a 4 U rack height is substantially (i.e., +/−20%) 7.0" high.

In certain embodiments, some or all of the information handling systems 210 are configured as hermetically sealed liquid cooled information handling systems. In certain embodiments, the hermetically sealed liquid cooled information handling systems correspond to systems having high powered heat producing components. In certain embodiments, other information handling systems 210 are configured as air cooled information handling systems. In certain embodiments, the air cooled information handling systems correspond to systems that do not require liquid cooling to function properly.

In certain embodiments, the rack includes a coolant distribution unit. In certain embodiments, the liquid cooled information handling systems are thermally coupled with the cooling distribution unit. In certain embodiments, the coolant distribution unit provides a closed loop via which the coolant is provided to and removed from the liquid cooled information handling systems. In certain embodiments, the coolant distribution unit can simultaneously facilitate cooling of multiple information handling systems.

Figure 3:
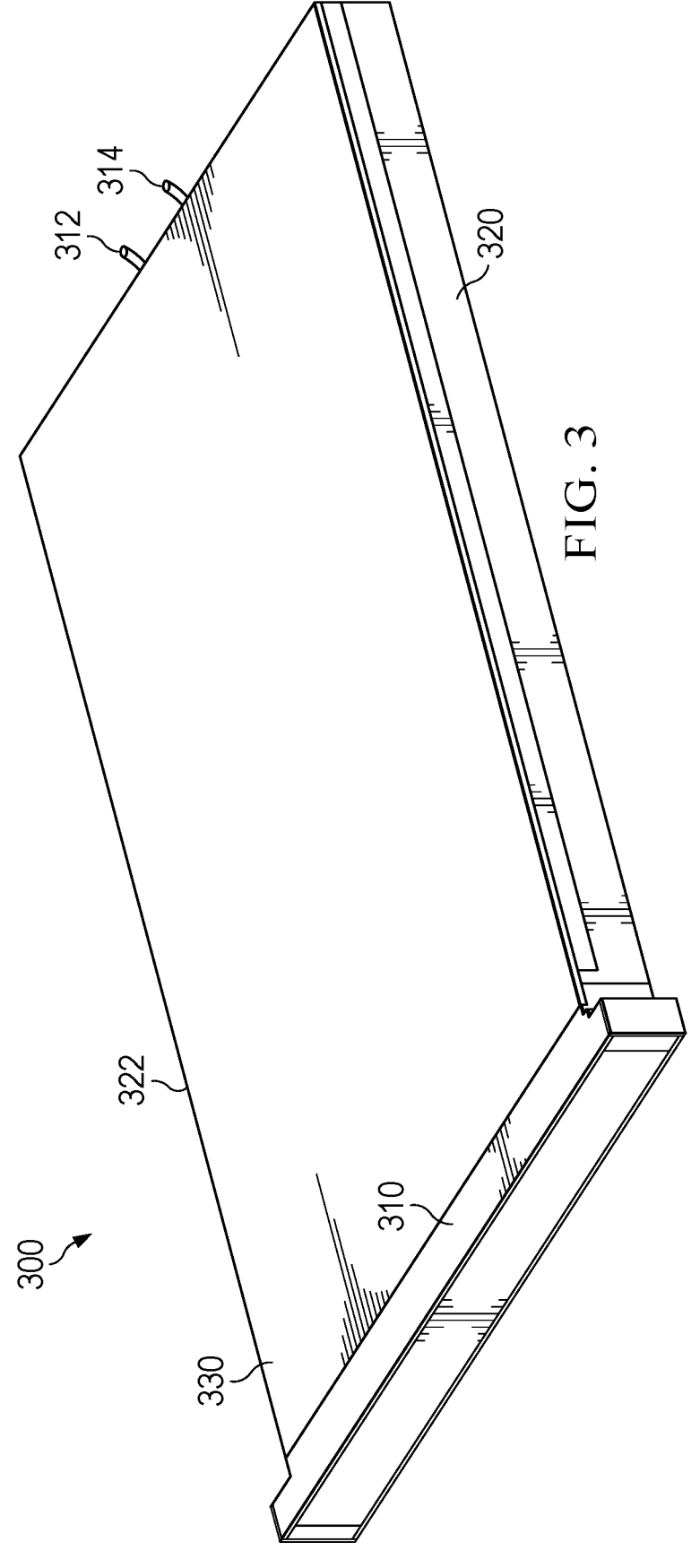
FIG. 3 shows a generalized perspective view of an example server type information handling system.

FIG. 3 shows a generalized perspective view of an example blade server type information handling system 300. In certain embodiments, the server type information handling system includes a front portion 310, which is accessible when the server type information handing system 300 is mounted on a server rack. In certain embodiments, the side portions 320, 322 mount to the rack via respective server mounting components. In certain embodiments, the side portions mount to the rack via respective mechanical guiding features which are mechanically coupled to respective server mounting components. In certain embodiments, the server type information handling system can slide out from the rack via the respective mechanical guiding features. In certain embodiments, internal components of the blade type information handling system 300 may be accessed by removing a top panel 330 of the blade type information handing system 300. In certain embodiments, the blade type information handing system 300 includes a bay via which components may be mounted to the blade type information handling system.

In certain embodiments, the information handling system 300 is configured for internal immersion cooling. As used herein, immersion cooling, broadly refers to a technique used for cooling in which heat producing components of the information handling system are submerged in a thermally conductive but electrically insulating liquid coolant. With immersion cooling, the heat producing components are contained within a liquid tight chassis. With immersion cooling, heat produced by the heat producing components is removed from the information handling system by placing the coolant in direct thermal contact with hot components. The liquid which is heated from the contact with the hot components is circulated through heat exchangers. Immersion cooling is highly effective because liquid coolants absorb heat from the components of the information handling system as the liquid is circulated through the system.

In certain embodiments, the information handling system 300 is configured as a hermetically sealed enclosed chassis. The enclosed chassis includes cooling liquid inlet connector 312 and a cooling liquid outlet connector 314 to interface cooling liquid with the individual chassis. In certain embodiments, the hermetically sealed enclosed chassis is configured to be mounted within a rack. The connectors are thermally coupled with a closed loop cooling distribution unit which provides a closed loop via which the coolant is provided to and removed from the enclosed chassis. In certain embodiments, cooling of the liquid contained within the closed loop is facilitated by the coolant distribution unit.

In various embodiments, the top panel 330 is part of a chassis liquid cooling liquid distribution component. In certain embodiments, the chassis liquid cooling liquid distribution component is associated with a chassis top panel portion (i.e., a chassis lid portion). In certain embodiments, the chassis top panel portion is configured to hermetically seal the server chassis when installed, thereby maintaining the coolant within the chassis, and to be removable to allow for service of internal server components. In certain embodiments, the chassis top panel portion includes and is integrated with a coolant inlet. In certain embodiments, one or both the walls of the chassis and the top panel portion 330 include sealing components which assist in sealing the top panel portion 330 to the walls of the chassis when the top panel is installed on the chassis. In certain embodiments, the sealing components include gaskets.

In certain embodiments, the coolant inlet is coupled to the cooling liquid inlet connector 312. In certain embodiments, the chassis top panel portion is configured with a liquid distribution chamber which functions as a cavity which distributes the coolant received via the coolant input. In certain embodiments, the chassis top panel portion is configured with a plurality of liquid exit apertures. In certain embodiments, the plurality of liquid exit apertures include variously shaped exits or lengthened passageways which function as ducts to shape the cooling liquid flow. In certain embodiments, the plurality of liquid exit apertures shape the quantity and path of the cooling liquid flow towards higher powered components of the server type information handling system.

Figure 4A:
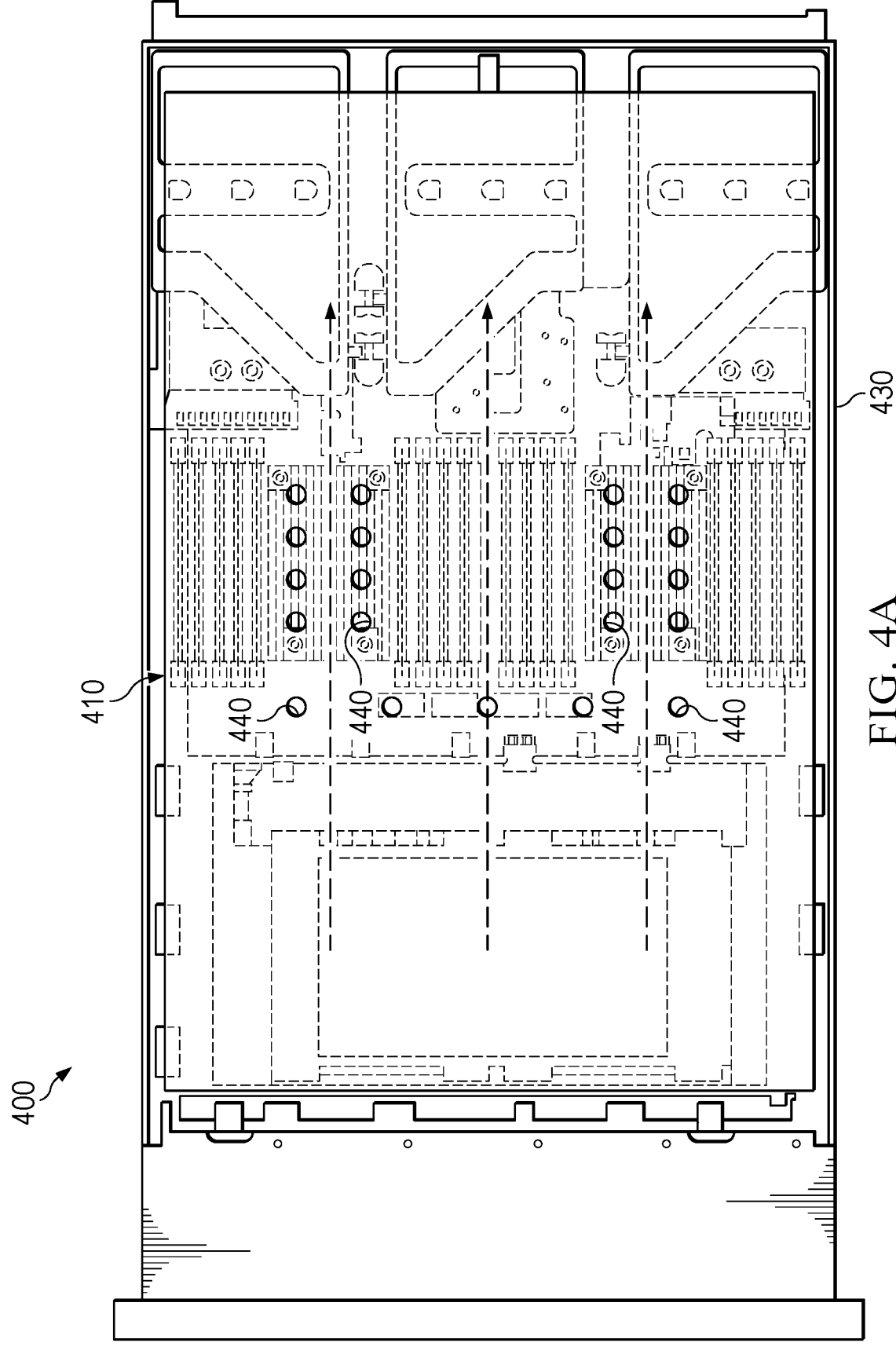
FIGS. 4A and 4B, generally referred to as FIG. 4, show cut away top views of an immersion cooled server type information handling system.
Figure 4B:
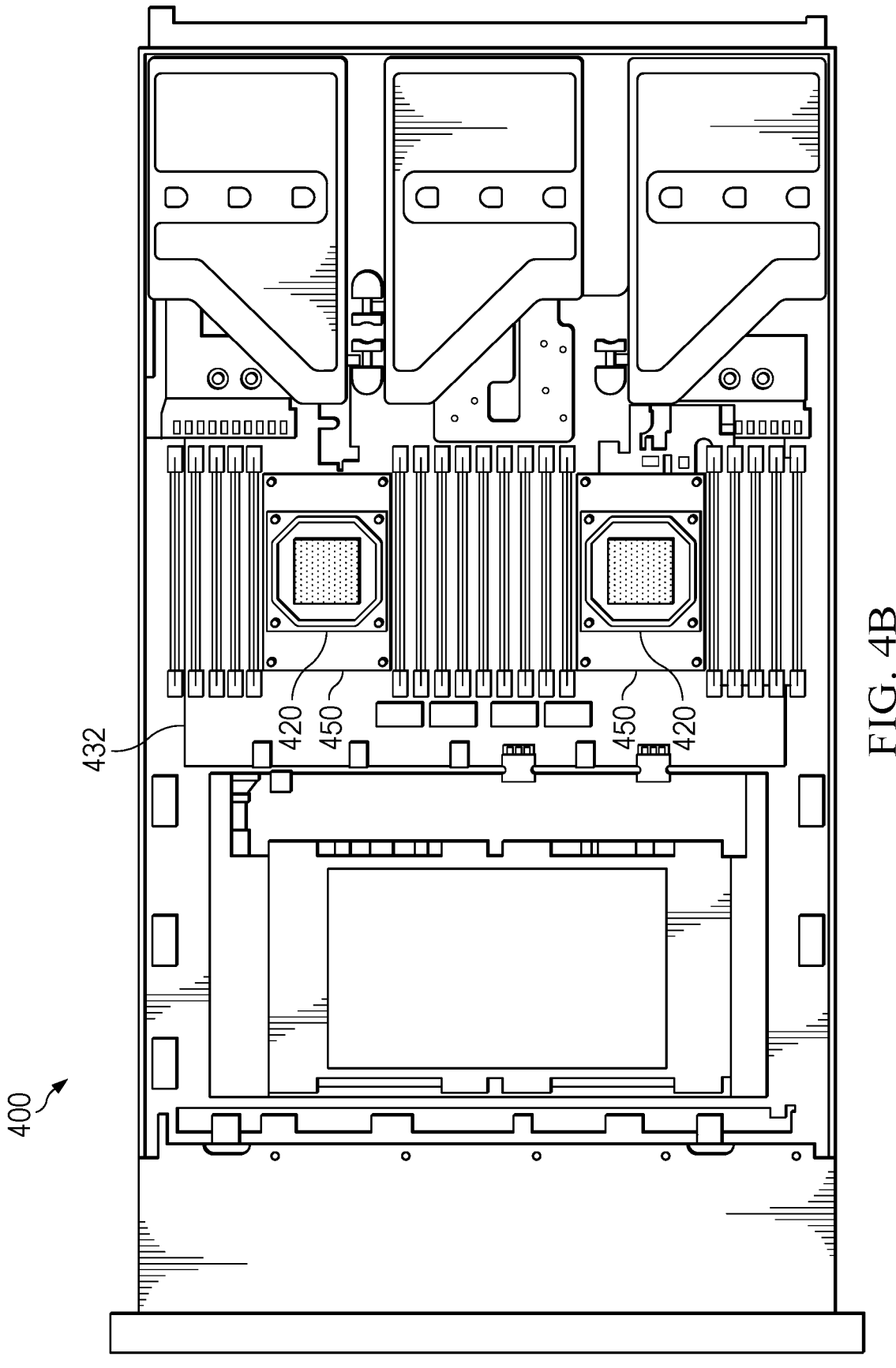
Figure 5:
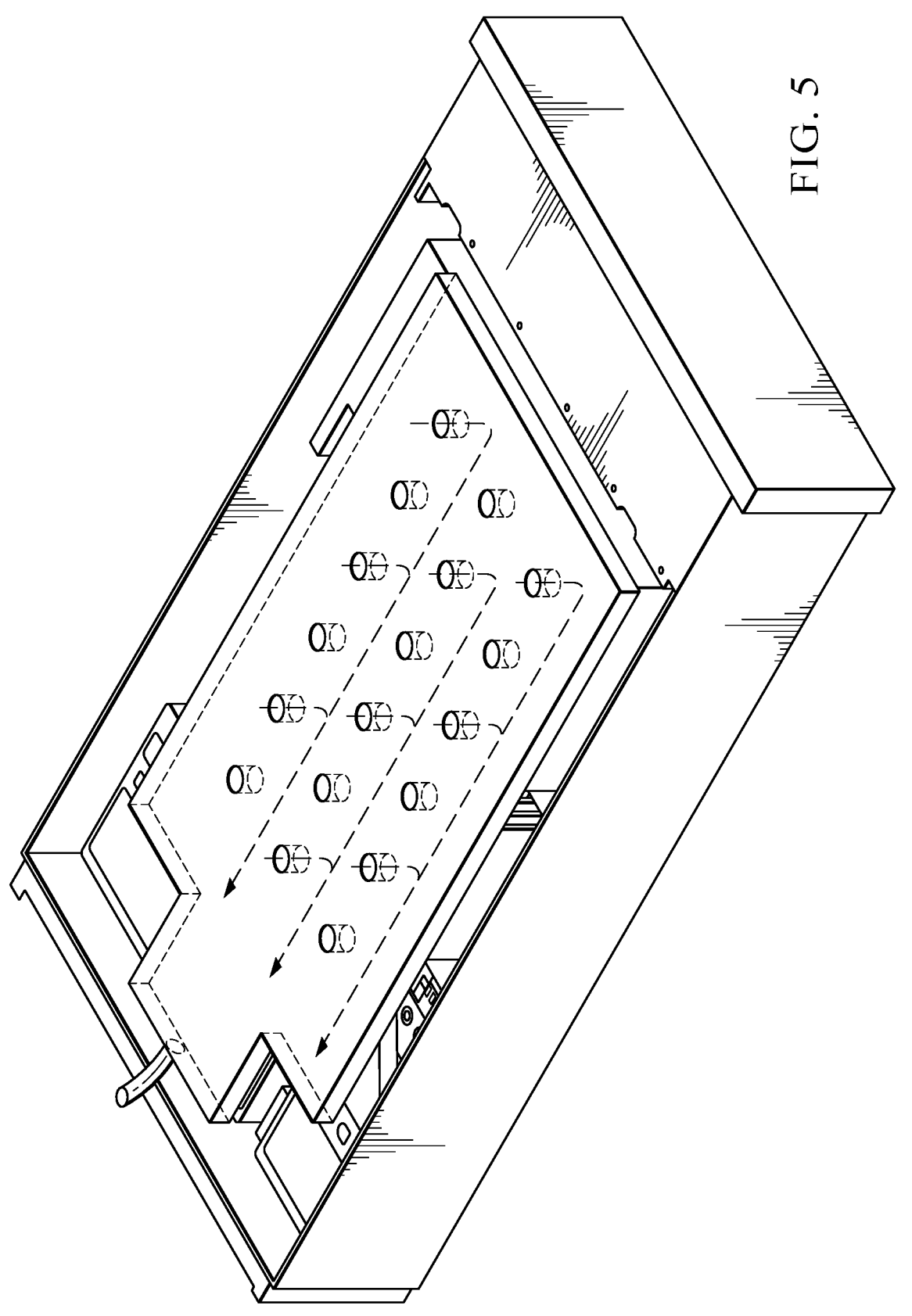
FIG. 5 shows a cut away top perspective view of an immersion cooled server type information handling system.

FIGS. 4A and 4B, generally referred to as FIG. 4, show cut away top views of an immersion cooled server type information handling system 400. FIG. 5 shows a cut away top perspective view of an immersion cooled server type information handling system. More specifically, FIG. 4A shows a cut away top view of an immersion cooled server type information handling system with a cross section of a chassis liquid cooling liquid distribution component 410. FIG. 4B shows a cut away top view of an immersion cooled server type information handling system with a cross section of the chassis below the chassis liquid cooling liquid distribution component 410. FIG. 5 shows a perspective view of a portion of a top panel of an immersion cooled server type information handling system.

In various embodiments, the immersion cooled server type information handling system 400 includes a liquid cooling liquid distribution system. In various embodiments, the liquid cooling liquid distribution system includes a liquid tight information handling system chassis (i.e., a chassis configured to enable liquid immersion cooling of components contained within the chassis), a chassis liquid cooling liquid distribution component 410, one or more heat spreader components 420, or a combination thereof.

Referring to FIG. 4A, in certain embodiments, the chassis liquid cooling liquid distribution component 410 is associated with a chassis top panel portion (i.e., a chassis lid portion). In certain embodiments, the chassis top panel portion is configured to hermetically seal the server chassis 430 when installed, thereby maintaining and containing the coolant within the chassis 430, and to be removable to allow for service of internal server components. In certain embodiments, the chassis top panel portion includes and is integrated with a coolant inlet. In certain embodiments, the chassis top panel portion is configured with a liquid distribution chamber which functions as a cavity which distributes the coolant received via the coolant input. In certain embodiments, the chassis top panel portion is configured with a plurality of liquid exit apertures 440. In certain embodiments, the plurality of liquid exit apertures 440 include variously shaped exits or lengthened passageways which function as ducts to shape the cooling liquid flow. In certain embodiments, the plurality of liquid exit apertures 440 shape the quantity and path of the cooling liquid flow towards high powered components 450 or high heat producing areas of the server type information handling system. In various embodiments, the focused exit apertures 440 are integrated into the chassis top panel portion generate a directional liquid flow towards the high powered components 450 or high heat producing areas. The forced liquid flow then guides heat away from the high powered components 450 or high heat producing areas and towards the hot liquid outlet.

In various embodiments, the liquid cooling liquid distribution system associates respective heat spreader components 420 with high powered components 450. In certain embodiments, the heat spreader components include low profile heat spreaders which maximize the surface area of a cooling surface when in contact with liquid. In certain embodiments, the low profile heat spreaders are similar to de-lidded water blocks (e.g., the low profile heat spreaders correspond to a base portion of a water block). As used herein, a water block broadly refers to a component designed to provide liquid cooling to individual components (e.g., central processing units, graphics processing units, etc.) within an information handling system to transfer heat away from the component on which the water block is installed. Water blocks often include a base panel which is thermally coupled to the component and a lid portion which provides a chamber to which cooling liquid is provided and removed. The coolant directed towards these low profile heat spreaders 420 carry away heat from their associated high power components. The coolant is then extracted from the server type information handling system via a coolant outlet integrated with the hermetically sealed chassis of the server type information handling system 400.

Figures 6A, 6B:
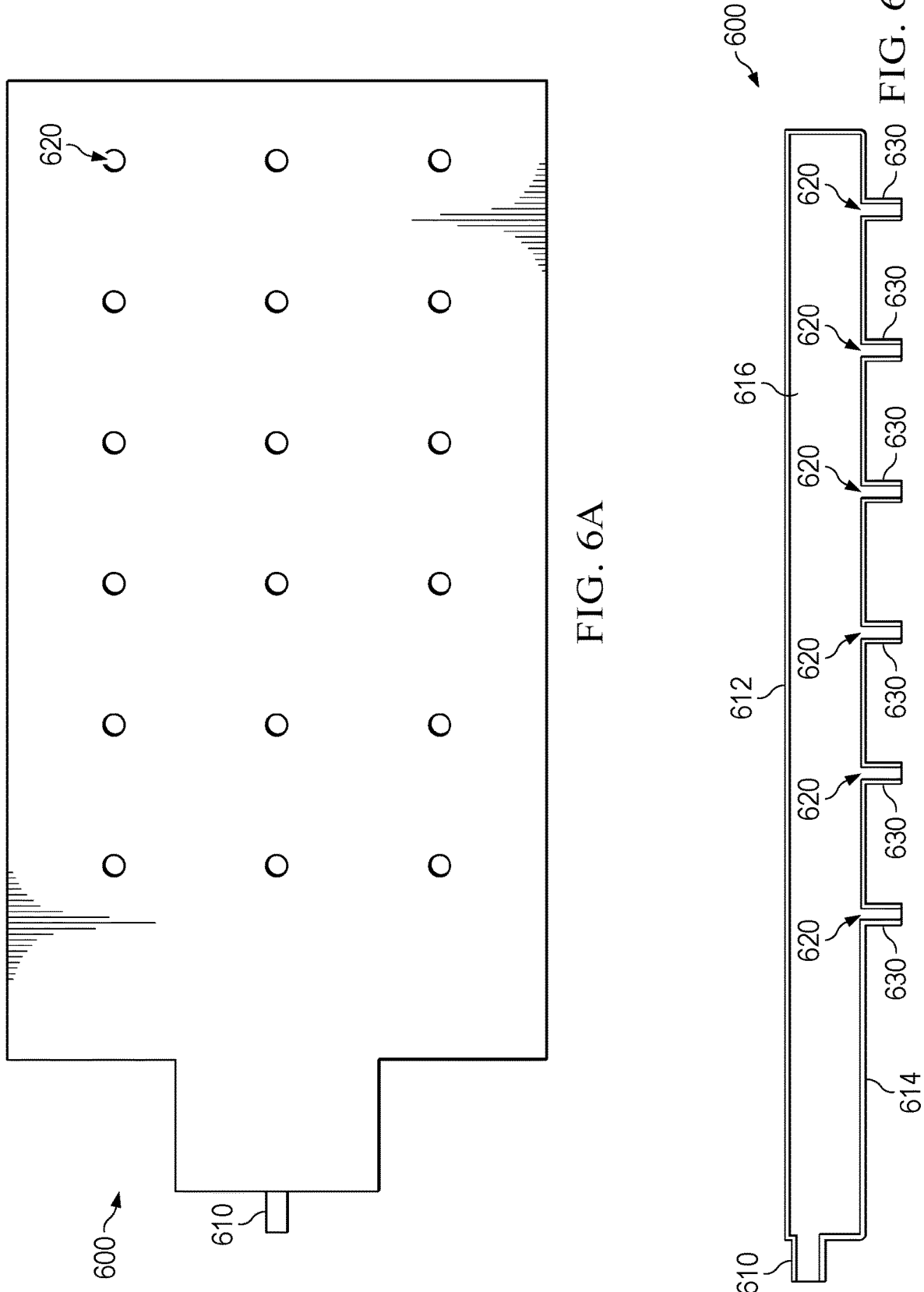
FIGS. 6A and 6B, generally referred to as FIG. 6, show bottom and side views of an example top panel portion of an immersion cooled server type information handling system.

FIGS. 6A and 6B, generally referred to as FIG. 6, show bottom and side views of an example top panel portion 600 of an immersion cooled server type information handling system. More specifically, in certain embodiments, the top panel portion 600 includes a liquid cool chassis inlet 610, a top panel top wall 612, a top panel bottom component 614, or a combination thereof. In certain embodiments, the top panel top wall 612 is hermetically sealed with the top panel bottom component 614 along the edges of the top panel bottom component 614 to provide a cooling liquid distribution chamber 616. In certain embodiments, the liquid distribution chamber 616 functions as a cavity via which coolant received via the coolant input 610 is distributed across the top of the interior of the information handling system chassis.

In certain embodiments, the top panel portion 600 includes a plurality of cold liquid outlets 620. In certain embodiments, the cold liquid outlets 620 comprise apertures defined by the top panel bottom component 614. In various embodiments, the cold liquid outlets 620 are positioned to direct cooling liquid flow across the top of the interior of the information handling system chassis of an information handling system. In certain embodiments, the cold liquid outlets 620 include respective liquid direction channels 630. In certain embodiments, the liquid direction channels 630 include respective vertical liquid direction tubes. In certain embodiments, the vertical liquid direction tubes are positioned to direct cooling liquid flow across the top of the interior of the information handling system chassis of an information handling system.

Figures 7A, 7B:
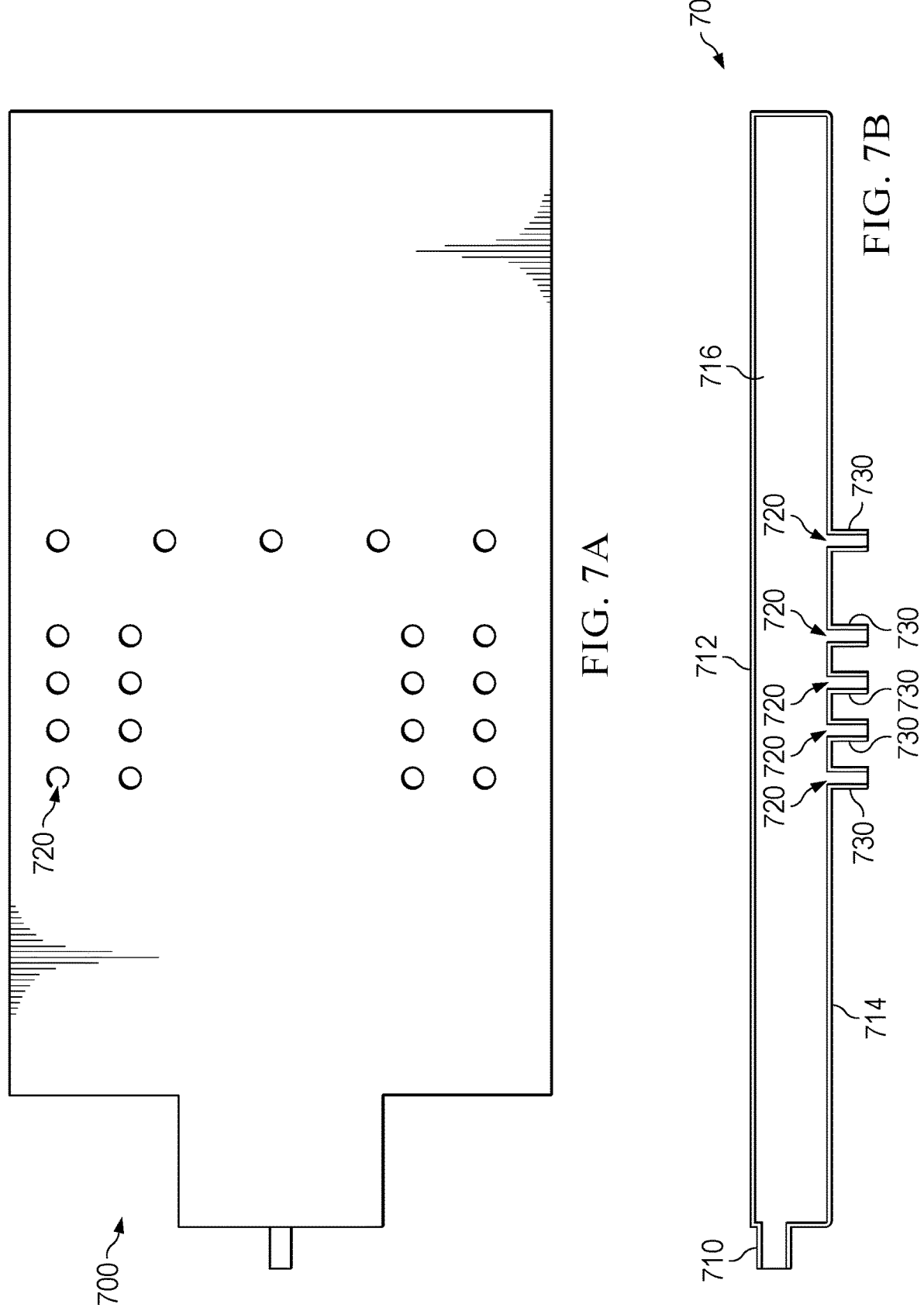
FIGS. 7A and 7B, generally referred to as FIG. 7, show bottom and side views of another example top panel portion of an immersion cooled server type information handling system.

FIGS. 7A and 7B, generally referred to as FIG. 7, show bottom and side views of another example top panel of an immersion cooled server type information handling system. More specifically, in certain embodiments, the top panel portion 700 includes a liquid cool chassis inlet 710, a top panel top wall 712, a top panel bottom component 714, or a combination thereof. In certain embodiments, the top panel top wall 712 is hermetically sealed with the top panel bottom component 714 to provide a cooling liquid distribution chamber 716. In certain embodiments, the liquid distribution chamber 716 functions as a cavity via which coolant received via the coolant input 710 is distributed across the top of the interior of the information handling system chassis.

In certain embodiments, the top panel portion 700 includes a plurality of cold liquid outlets 720. In certain embodiments, the cold liquid outlets 720 comprise apertures defined by the top panel bottom component 714. In various embodiments, the cold liquid outlets 720 are positioned to direct cooling liquid flow to high heat producing components of an information handling system. In certain embodiments, the cold liquid outlets 720 include respective liquid direction channels 730. In certain embodiments, the liquid direction channels 730 include respective vertical liquid direction tubes. In certain embodiments, the vertical liquid direction tubes are positioned to direct cooling liquid flow to high heat producing components of an information handling system.

Figure 8:
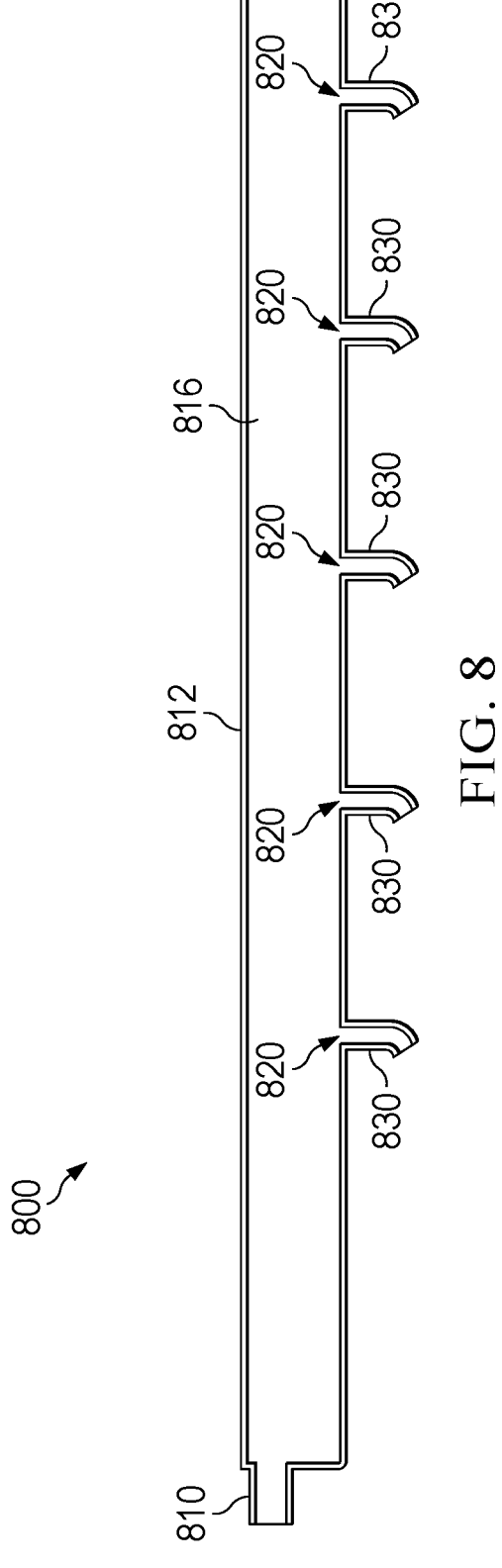
FIG. 8 shows a cut away side view of an alternate top panel of an immersion cooled server type information handling system.

FIG. 8 shows a cut away side view of an alternate top panel portion 800 of an immersion cooled server type information handling system. In certain embodiments, the top panel portion 800 includes a plurality of cold liquid outlets 820. In certain embodiments, the cold liquid outlets 820 comprise apertures defined by the top panel bottom component 814. In various embodiments, the cold liquid outlets 820 are positioned to direct cooling liquid flow to high heat producing components of an information handling system. In certain embodiments, the cold liquid outlets 820 include respective liquid direction channels 830. In certain embodiments, the liquid direction channels 830 include respective angled liquid direction tubes. In certain embodiments, the vertical liquid direction tubes are positioned to direct cooling liquid flow across high heat producing components of an information handling system.

Figure 9:
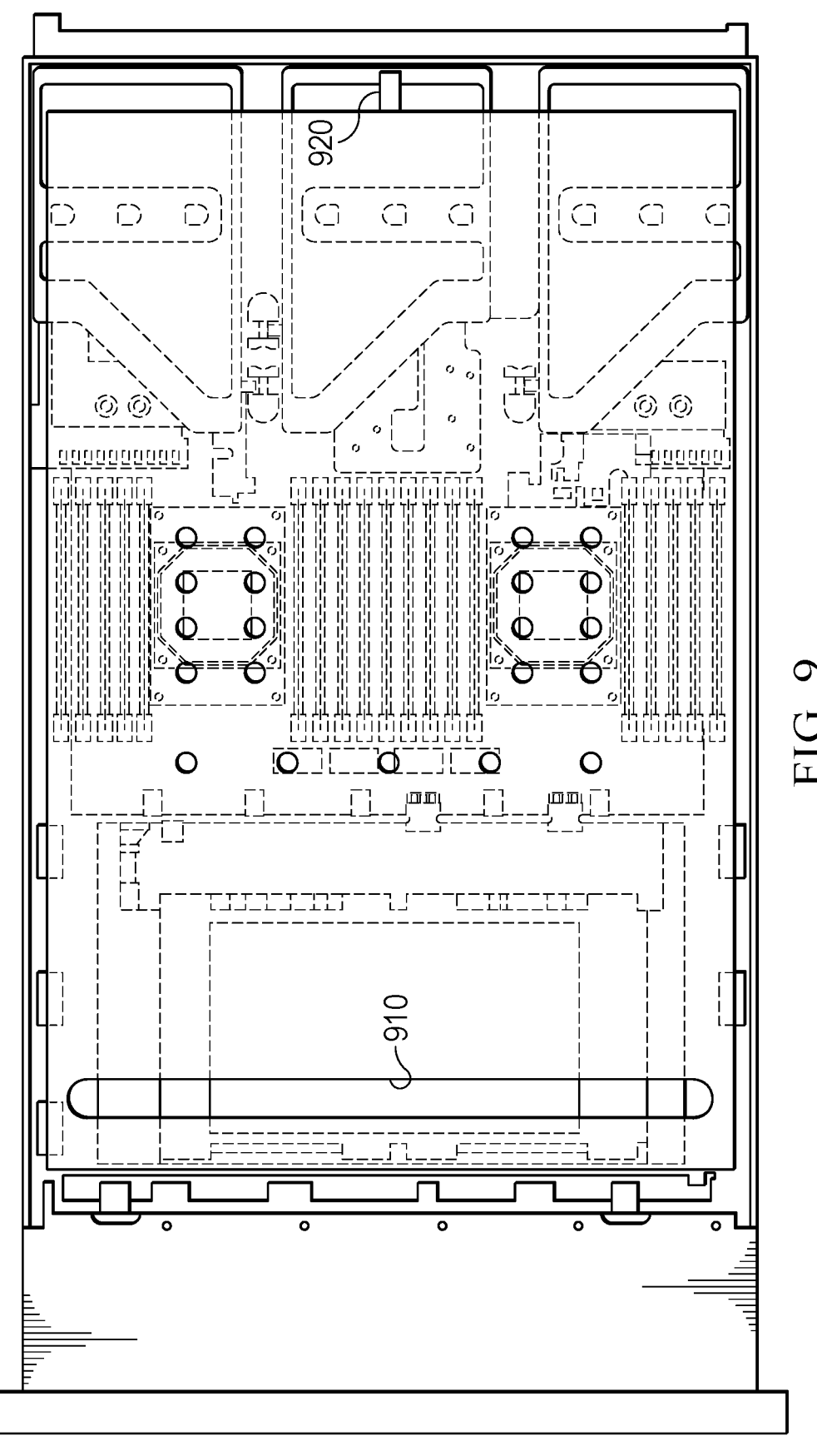
FIG. 9 shows a cut away top perspective view of an alternate immersion cooled server type information handling system.

FIG. 9 shows a cut away top perspective view of an alternate immersion cooled server type information handling system. In certain embodiments, the top panel portion 900 includes a cold liquid outlet 910. In certain embodiments, the cold liquid outlet 910 comprises an aperture defined by the top panel bottom component. In certain embodiments, the aperture comprises a slot. In certain embodiments, the cold liquid outlet 910 is positioned along an edge of the top panel portion 900 opposite an edge the cooling liquid inlet 920 is positioned. In certain embodiments, the cold liquid outlet 910 direct cooling liquid flow to from a front portion of the information handling system to a cooling liquid outlet.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A chassis liquid cooling liquid distribution component of an immersion cooled server information handling system, comprising:
   a top panel portion, the top panel portion comprising a top panel top wall and a top panel bottom component, the top panel top wall and the top panel bottom component being hermetically sealed along edges of the top panel bottom component to provide a liquid distribution chamber, the top panel bottom component defining a plurality of cold liquid outlets, the plurality of cold liquid outlets being positioned to direct cooling liquid flow across a top of an interior of an information handling system chassis of the immersion cooled server information handling system.

2. The chassis liquid cooling liquid distribution component of claim 1, wherein:
   a cold liquid outlet is positioned to direct the cooling liquid flow towards a heat generating component of the immersion cooled server information handling system.

3. The chassis liquid cooling liquid distribution component of claim 2, wherein:
   a heat spreader component is thermally coupled to the heat generating component; and,
   the cooling liquid flow is directed towards the heat spreader component.

4. The chassis liquid cooling liquid distribution component of claim 3, wherein:
   the heat spreader component comprises a base portion of a water block.

5. The chassis liquid cooling liquid distribution component of claim 1, wherein:
   at least some of the cold liquid outlets include respective liquid direction channels.

6. The chassis liquid cooling liquid distribution component of claim 1, wherein:
   the top panel bottom component defines a cold liquid outlet positioned along an edge of the top panel portion opposite a cooling liquid inlet.

7. A cooling liquid distribution system for an immersion cooled server information handling system comprising:
   an information handling system chassis; and,
   a top panel portion, the top panel portion comprising a top panel top wall and a top panel bottom component, the top panel top wall being configured to be hermetically sealed to the information handling system chassis when the top panel portion is installed on the information handling system chassis, the top panel top wall and the top panel bottom component being hermetically sealed along edges of the top panel bottom component to provide a liquid distribution chamber, the top panel bottom component defining a plurality of cold liquid outlets, the plurality of cold liquid outlets being positioned to direct cooling liquid flow across a top of an interior of the information handling system chassis of the immersion cooled server information handling system.

8. The cooling liquid distribution system of claim 7, wherein:

a cold liquid outlet is positioned to direct the cooling liquid flow towards a heat generating component of the immersion cooled server information handling system.

9. The cooling liquid distribution system of claim 8, wherein:

a heat spreader component is thermally coupled to the heat generating component; and, the cooling liquid flow is directed towards the heat spreader component.

10. The cooling liquid distribution system of claim 9, wherein:

the heat spreader component comprises a base portion of a water block.

11. The cooling liquid distribution system of claim 7, wherein:

at least some of the cold liquid outlets include respective liquid direction channels.

12. The cooling liquid distribution system of claim 7, wherein:

the top panel bottom component defines a cold liquid outlet positioned along an edge of the top panel portion opposite a cooling liquid inlet.

13. A system comprising:

an information handling system chassis;

a processor contained within the information handling system chassis;

a data bus coupled to the processor; and, a top panel portion, the top panel portion comprising a top panel top wall and a top panel bottom component, the top panel top wall being configured to be hermetically sealed to the information handling system chassis when the top panel portion is installed on the information handling system chassis, the top panel top wall and the top panel bottom component being hermetically sealed along edges of the top panel bottom component to provide a liquid distribution chamber, the top panel bottom component defining a plurality of cold liquid outlets, the plurality of cold liquid outlets being positioned to direct the cooling liquid flow across a top of an interior of the information handling system chassis of an immersion cooled server information handling system.

14. The system of claim 13, wherein:

a cold liquid outlet is positioned to direct the cooling liquid flow towards a heat generating component of the immersion cooled server information handling system.

15. The system of claim 14, wherein:

a heat spreader component is thermally coupled to the heat generating component; and, the cooling liquid flow is directed towards the heat spreader component.

16. The system of claim 15, wherein:

the heat spreader component comprises a base portion of a water block.

17. The system of claim 13, further comprising:

at least some of the cold liquid outlets include respective liquid direction channels.

18. The system of claim 13, wherein:

the top panel bottom component defines a cold liquid outlet positioned along an edge of the top panel portion opposite a cooling liquid inlet.

* * * * *